United States Patent
Mulder et al.

(10) Patent No.: US 11,137,460 B2
(45) Date of Patent: Oct. 5, 2021

(54) COOLING A GRADIENT COIL OF A MAGNETIC RESONANCE IMAGING SYSTEM

(71) Applicant: KONINKLIJKE PHILIPS N.V., Eindhoven (NL)

(72) Inventors: Gerardus Bernardus Jozef Mulder, Best (NL); Martijn Krelis Termeer, Poppel (BE); Theo Jenneskens, Best (NL); Jan Konijn, Den Bosch (NL); Guus Van Hest, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/610,147

(22) PCT Filed: May 3, 2018

(86) PCT No.: PCT/EP2018/061250
§ 371 (c)(1),
(2) Date: Nov. 1, 2019

(87) PCT Pub. No.: WO2018/206370
PCT Pub. Date: Nov. 15, 2018

(65) Prior Publication Data
US 2020/0072923 A1 Mar. 5, 2020

(30) Foreign Application Priority Data

May 8, 2017 (EP) .................................... 17169855

(51) Int. Cl.
*G01R 33/385* (2006.01)
(52) U.S. Cl.
CPC ..... *G01R 33/3856* (2013.01); *G01R 33/3858* (2013.01)

(58) Field of Classification Search
CPC ........................ G01R 33/3856; G01R 33/3858
See application file for complete search history.

(56) References Cited

U.S. PATENT DOCUMENTS 5,559,435 A * 9/1996 Harada .............. G01R 33/3856
324/307
5,744,784 A 4/1998 Schluckbier
(Continued)

FOREIGN PATENT DOCUMENTS

GB 2342986 A * 4/2000 ......... H01F 27/2876

OTHER PUBLICATIONS

Thesis Jan Kroot, Analysis of Eddy Currents in a Gradient Coil, 2006.
(Continued)

*Primary Examiner* — Daniel R Miller

(57) ABSTRACT

A gradient coil assembly for a magnetic resonance imaging system (1) includes at least one gradient coil (2) and a cooling arangement for cooling the gradient coil (2). The gradient coil (2) includes a solid electrical conductor material forming one or more conductor lines (21, 31, 41) which are in direct contact with each other. The cooling arrangement includes a cooling channel (22, 32, 42) for guiding a cooling fluid (10). The cooling channel (22, 32, 42) is arranged outside along the one or more conductor lines (21, 31, 41) in such a way that in a cross-sectional view one single continuous interface line between the cooling channel (22, 32, 42) and the one or more conductor lines (21, 31, 41) is formed. In this way efficient cooling of the gradient coil (2) may be achieved.

20 Claims, 2 Drawing Sheets

(56) References Cited

U.S. PATENT DOCUMENTS

| | | | |
|---|---|---|---|
| 6,236,207 B1 | 5/2001 | Arz et al. | |
| 6,741,152 B1* | 5/2004 | Arz | G01R 33/3856 |
| | | | 174/15.1 |
| 7,741,152 B2 | 6/2010 | Huang et al. | |
| 2003/0141870 A1* | 7/2003 | Schuster | G01R 33/3856 |
| | | | 324/318 |
| 2005/0035764 A1 | 2/2005 | Mantone et al. | |
| 2005/0168222 A1 | 8/2005 | Arz et al. | |
| 2007/0272394 A1* | 11/2007 | Heid | H01F 27/08 |
| | | | 165/104.33 |
| 2015/0177347 A1* | 6/2015 | Tsujita | G01R 33/3858 |
| | | | 324/322 |
| 2016/0069970 A1 | 3/2016 | Rearick et al. | |
| 2017/0038444 A1* | 2/2017 | Seeber | G01R 33/3858 |
| 2018/0120394 A1* | 5/2018 | Seeber | G01R 33/3856 |

OTHER PUBLICATIONS

International Search Report and Written Opinion from PCT/EP2018/061250 dated Jul. 6, 2018.

* cited by examiner

COOLING A GRADIENT COIL OF A MAGNETIC RESONANCE IMAGING SYSTEM

CROSS REFERENCE TO RELATED APPLICATIONS

This application is a U.S. national phase application of International Application No. PCT/EP2018/061250 filed on May 3, 2018, which claims the benefit of EP Application Serial No. 17169855.8 filed on May 8, 2017 and is incorporated herein by reference.

FIELD OF THE INVENTION

The invention relates to the field of resonance imaging systems and especially to a gradient coil assembly for a magnetic resonance imaging (MRI) system, the gradient coil assembly comprising at least one gradient coil and a cooling arangement for cooling the gradient coil, to an magnetic resonance imaging system with such a gradient coil assembly, to a method for manufacturing such a gradient coil assembly and to a method for cooling a gradient coil of a magnetic resonance imaging system.

BACKGROUND OF THE INVENTION

Gradient coils are usually built of loops of wire or thin conductive sheets which are provided on a cylindrical shell lying just inside the bore of an MRI system. When an electrical current is passed through these coils a secondary magnetic field is created. This secondary magnetic field constitutes a gradient field which superimposes the main magnetic field, thereby causing the resonance frequency of protons to vary as a function of position. In this way, spatial encoding of the magnetic resonance signals becomes possible. Further, gradient coils are also used for different physiologic techniques, such as magnetic resonance angiography, diffusion, and perfusion imaging.

The walls along the inner bore of an MRI system usually become warm when an examination object is examined. This heating is mainly caused by eddy currents and resistive heating as current is passed through the gradient coil. Such gradient coils are typically driven by powerful pulse-width modulated amplifiers with peak coil driving voltages up to 2000 V and currents exceeding 600 A. Thus, intense gradient heat is created with maximum internal coil temperatures reaching 55 to 60° C. The power required for operating a gradient coil scales with the fifth power of its radius which means that gradient coil design and cooling of gradient coils is even more difficult for modern wide-bore systems.

In this situation, for all gradient coils in MRI systems usually fluidic cooling is used in order to reduce the heating effects. Typically, water or a water-ethylene glycol solution from a heat exchange pump is used as a cooling fluid which is circulated through cooling channels of a cooling arrangement of the MRI system, the cooling channels being in thermally conducting contact with the gradient coil.

In U.S. Pat. No. 7,741,152 B1 a gradient coil assembly with a gradient coil comprised of four electrical conductor lines and a cooling channel for cooling these electrical conductor lines by a cooling fluid guided in the cooling channel is shown. The electrical conductor lines are arranged with a distance from each other while two of the electrical conductor lines are arranged on one side of the cooling channel and the other two electrical conductor lines are arranged on the opposite side of the cooling channel. However, this arrangement has disadvantages with respect to relatively high eddy currents and inefficient cooling.

The British patent application GB 2 342 986 concerns a direct cooled magnet coil comprising a plurality of segmented conductors enclosing a cooling pipe. The wall of the cooling pipe separates the coolant from the segmented conductors.

SUMMARY OF THE INVENTION

It is an object of the invention to provide efficient cooling of a gradient coil for an MRI system.

Therefore, according to a first aspect of the invention a gradient coil assembly for a magnetic resonance imaging system is provided, the gradient coil assembly comprising at least one gradient coil and a cooling arangement for cooling the gradient coil, wherein
the gradient coil is comprised of a solid electrical conductor material forming one conductor line or more conductor lines which are in direct contact with each other,
the cooling arangement comprises a cooling channel for conducting a cooling fluid, and
the cooling channel is arranged outside along the one or more conductor lines in such a way that in a cross-sectional view one single continuous interface line between the cooling channel and the one or more conductor lines is formed.

The cross-sectional view according to the present invention is a view in a plane which is perpendicular to the respective longitudinal direction of the one or more conductor lines. Because of the curvature of the windings of the gradient coil the longitudinal direction changes along the way of the one or more conductor lines.

Thus, according to the invention the cooling channel is arranged outside and along the one or more conductor lines. In this way, the cross section of the one or more conductor lines can be kept small reducing the effect of eddy currents. Further, in a cross-sectional view, there is only one single interface line between the cooling channel and the one or more conductor lines which provides for a very compact design which increases the cooling efficiency and further reduces eddy currents.

Preferably, the cooling channel has a transverse cross section that is open at one side, in particular having a U-shape or C shape, and the open side being covered by the interface between the cooling channel and the one or more conductor lines to which the cooling channel is abutted. The transverse direction is transverse, preferably orthogonal to, the long axis of the channel. The U shape may have rounded or sharp corners between U-shape's base and legs.

In general, the cooling channels can be made from different materials which are either electrically non-conductive materials or conductive materials with a much lower electrical conductivity than the one or more conductor lines and/or having a wall thickness much smaller than the dimensions of the one or more conductor lines. However, according to a preferred embodiment of the invention, the cooling channel is made of a plastic material or stainless steel which is fixed, preferably molded or bonded, to the one or more conductor lines.

According to a preferred of the invention the interface between the cooling channel and the one or more conductor lines is comprised of an inner wall. In this way a sufficient stability of the design may be guaranteed.

Alternatively, according to a preferred embodiment of the invention, the cooling channel is open at at least part of its interface with the one or more conductor lines thereby allowing cooling fluid flowing in the cooling channel to get into direct contact with at least a part of the surface of the one or more conductor lines. Compared to providing a wall between the cooling fluid and the one or more conductor lines this allows an even more efficient cooling of the one or more conductor lines.

The gradient coil can be made of different materials. However, preferably the solid electrical conductor material of the gradient coil is copper or aluminum.

The invention also relates to a magnetic resonance imaging system with a gradient coil assembly as described above.

Further, the invention also relates to a method for manufacturing a gradient coil assembly as described above wherein the one or more conductor lines and the cooling channel are made by coextrusion or extruded separately first and then fixed to each other, preferably by molding or bonding. In this way, long integrated conductor-cooling channel arrangements may be received which can then be used to wind an X, Y or Z coil of the gradient coil. This can be done on a holder plate or by using tooling.

The invention also relates to a method for cooling a gradient coil for a magnetic resonance imaging system, wherein
the gradient coil is comprised of a solid electrical conductor material forming one conductor line or more conductor lines which are in direct contact with each other, and
a cooling fluid is guided outside along the one or more conductor lines in such a way that in a cross-sectional view there is one single continuous interface line between the cooling fluid and the one or more conductor lines.

According to an embodiment of the invention the interface line may be comprised of a wall. Even more preferably, the cooling fluid is in direct contact with a part of the surface of the one or more conductor lines which further enhances the cooling efficiency.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
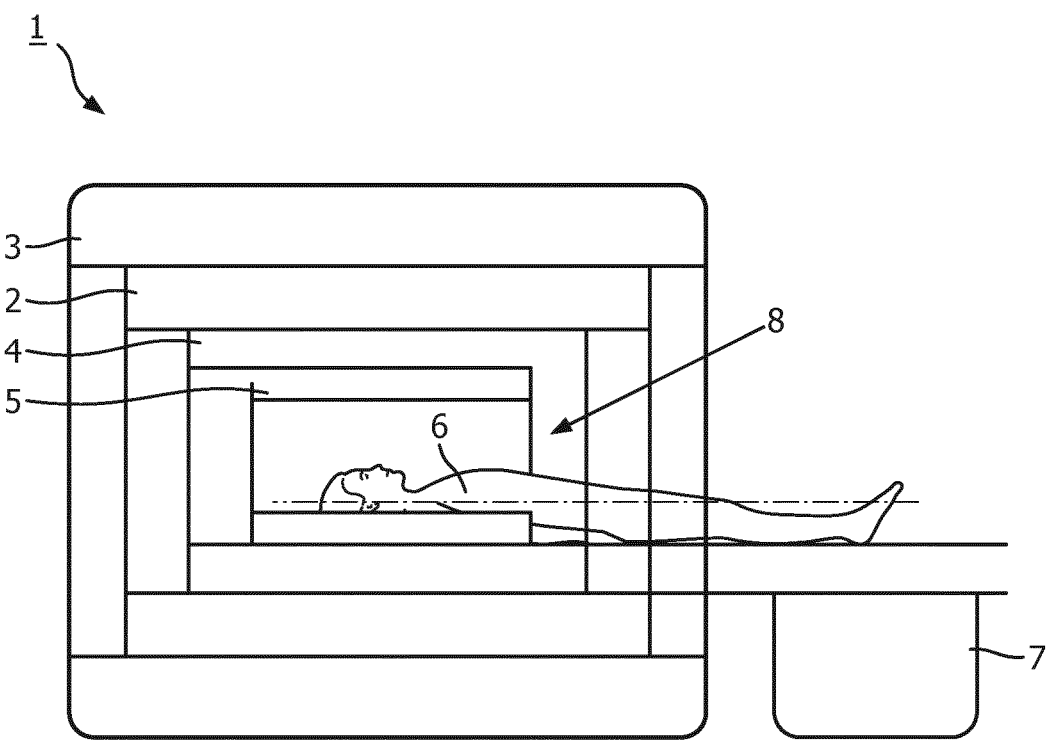
FIG. 1 is a schematic longitudinal sectional view of an MRI system 1 according to an embodiment of the invention.

In FIG. 1 a schematic longitudinal sectional view of an MRI system 1 according to an embodiment of the invention is depicted. This MRI system 1 comprises a gradient coil 2, a magnet 3, an RF transmit coil 4, and an RF receive coil 5. An examination object 6, e.g. a patient, can be positioned on an patient support 7. With this patient support 7 the examination object 6 can be disposed in an examination area 8 in the MRI system 1 which is surrounded by the magnet 3, the gradient coil 2, the RF transmit coil 4 and the RF receive coil 5 for MRI examination.

According to the present invention it has been found that when AC dissipation in the gradient coil 2 needs to be limited to be able to increase AC rms gradient strength, it is beneficial to reduce the cross section of the conductor of the gradient coil 2 and to wind coil patterns that are sparse. In order to maintain good cooling efficiency in such a situation cooling fluid is brought in thermal contact with the conductor on the outside of the conductor as described below in more detail. In this way the invention provides for very small solid conductor cross-sections while keeping direct cooling possible with a coolant in close thermal contact with the conductor. By keeping the cross-section of the conductors small eddy current losses are minimised. At the same time a cooling fluid is guided along the conductor sharing thermal contact with the conductor. This leads to direct efficient cooling and because the cooling channel has low electric conductivity, eddy current losses in the cooling channel are small.

Figure 2:
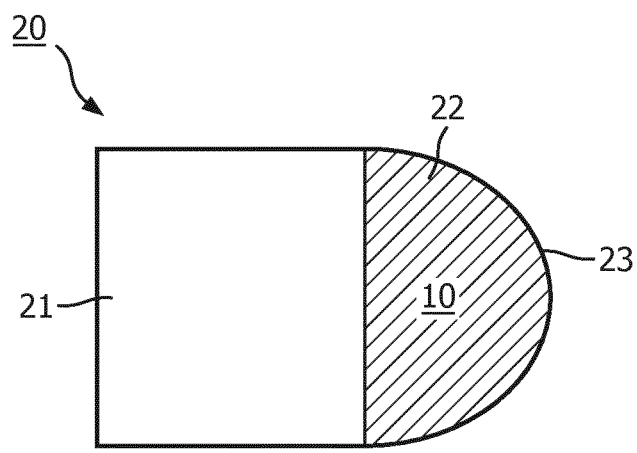
FIG. 2 is a schematic cross-sectional view of an embodiment of a gradient coil assembly according to the present invention.

In FIG. 2 a schematic cross-sectional view of an embodiment of a gradient coil assembly 20 according to the present invention for a magnetic resonance imaging system 1 like the one shown if FIG. 1 is depicted. The gradient coil assembly 20 according to FIG. 2 comprises a solid electrical conductor material, i.e. copper, forming a single conductor line 11 which comprises a square cross-section. Further, the cooling arangement 20 according to FIG. 2 comprises a cooling channel 22 with an outer wall 23 for guiding a cooling fluid 10. According to the present embodiment, the outer wall 23 of the cooling channel 22 is made of a plastic material.

This cooling channel 22 has a semi-circular cross section and, thus, is open on one side. For forming the cooling channel 22 for conducting the cooling fluid 14, the outer wall 23 of the cooling channel 22 is bonded to the conductor line 21. In this way the cooling fluid 10 may get into direct contact with the outer surface of the conductor line 21. Avoiding an inner wall of the cooling channel 22 helps efficiently removing heat from the conductor line 21.

From FIG. 2 it can be understood that the cooling channel 22 is arranged outside along the conductor line 21 in such a way that in a cross-sectional view one single continuous interface line between the cooling channel 22 and the conductor line 21 is formed. In the present cross-sectional view, this interface line is given by the outer surface of the conductor line 21 on the right side where the cooling channel 22 is arranged and where the cooling fluid 10 gets into direct contact with the outer surface of the conductor line 21.

Figure 3:
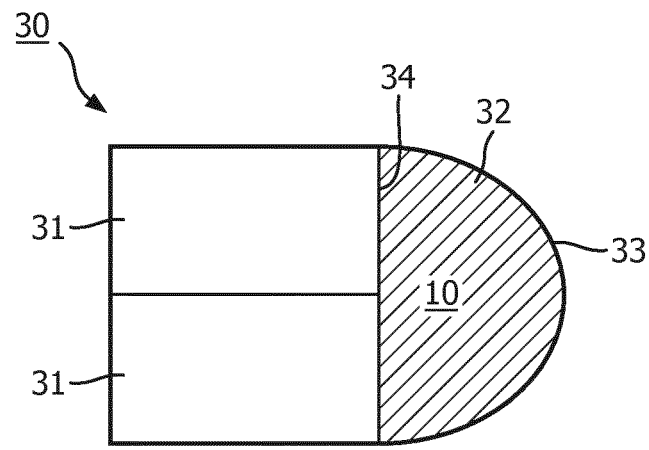
FIG. 3 is a schematic cross-sectional view of another embodiment of a gradient coil assembly according to the present invention.

The embodiment shown in FIG. 3 is similar to the embodiment shown in FIG. 2. However, in contrast to the embodiment shown in FIG. 2, the embodiment of FIG. 3 comprises two conductor lines 31 with rectangular cross-section which are in direct contact with each other. Having two conductor lines 31 with smaller cross-sections instead of one single conductor 21 with a bigger cross-section as in FIG. 2 makes it easier to wind coil patterns for the gradient coil 2 with small curvatures.

Further, there is a difference according to the embodiment shown in FIG. 3 in that an inner wall 34 is provided which is in direct contact with conductor line 31. Therefore, the cooling channel 32 is comprised of a tube which is made of the semicircular outer wall 33 and the inner wall 34 which has the form of a straight line. This inner wall 34 makes the manufacturing of the cooling channel 32 easier while heat transfer from the conductor line 31 might not be as effective as in the embodiment of FIG. 2.

Figure 4:
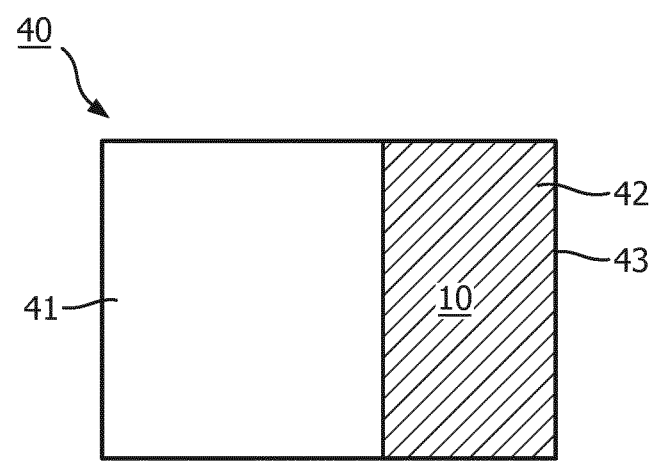
FIG. 4 is a schematic cross-sectional view of still another embodiment of a gradient coil assembly according to the present invention.

Finally, in FIG. 4 an embodiment is depicted which omitts an inner wall as in the embodiment of FIG. 2 with the only difference that the cross-section of the cooling channel 23 is rectangular.

For the embodiments shown in FIGS. 2, 3 and 4 long conductor-cooling channels can be made at once by extrusion or in two-step approaches where the conductor and the cooling channel are made by extrusion separately and are glued or bonded together. These long integrated conductor-cooling channels can then be used to wind an X, Y or Z coil of the gradient coil. This can be done on a holder plate or using tooling.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST

1 MRI system
2 gradient coil
3 magnet
4 RF transmit coil
5 RF receive coil
6 examination object
7 patient support
8 examination area
10 cooling fluid
20 gradient coil assembly
21 conductor line
22 cooling channel
23 outer wall
30 gradient coil assembly
31 conductor line
32 cooling channel
33 outer wall
34 inner wall
40 gradient coil assembly
41 conductor line
42 cooling channel
43 outer wall

The invention claimed is:

1. A gradient coil assembly for a magnetic resonance imaging system, comprising:
a gradient coil comprised of a solid electrical conductor material forming a plurality of solid conductor lines which are in direct contact with each other and have no interior channel,
a cooling channel for guiding a cooling fluid, the cooling channel being arranged outside along each of the plurality of solid conductor lines in such a way that in a cross-sectional view one single continuous interface line between the cooling channel and the plurality of solid conductor lines is formed, such that the cooling fluid contacts a part of a surface of each of the plurality of solid conductor lines.

2. The gradient coil assembly according to claim 1, wherein the cooling channel has a transverse cross section that is open at one side, in particular having a U-shape or C-shape, and the open side being between the cooling channel and the plurality of conductor lines such that the cooling fluid directly contacts each of the plurality of solid conductor lines.

3. The gradient coil assembly according to claim 1, wherein the cooling channel includes an inner wall in direct contact with each of the plurality of solid conductor lines.

4. The gradient coil assembly according to claim 1, wherein in transverse cross-section, the plurality of solid conductor lines form a solid expanse of the electrical conductor material without any interior channels.

5. The gradient coil assembly according to claim 1, wherein the plurality of solid electrical conductors includes two solid electrical conductors fixed directly to each other and the cooling channel directly contacts exterior surfaces of both of the two solid electrical conductors.

6. The gradient coil assembly according to claim 1, wherein the interface between the cooling channel and the plurality of solid conductor lines is not formed along a complete circumference of the plurality of solid conductor lines.

7. A magnetic resonance imaging system with a gradient coil assembly according to claim 1.

8. A method for manufacturing a gradient coil assembly according claim 1 wherein the plurality of solid conductor lines and the cooling channel are made by coextrusion or extruded separately first and then fixed to each other.

9. A method for cooling a gradient coil for a magnetic resonance imaging system, wherein
the gradient coil is comprised of a solid electrical conductor material forming one of:
a single solid conductor line without an internal channel, and
a plurality of directly abutting solid conductor lines which are in direct contact with each other without any internal channels, and
a cooling fluid is guided along an outer surface of the single solid conductor line or each of the plurality of solid conductor lines in such a way that in a cross-sectional view there is only one single continuous interface line between the cooling fluid and the outer surface of:
the single solid conductor line, or
the plurality of solid conductor lines,
the solid conductor lines and the cooling fluid being in direct contact with a part of the outer surface of:
the single solid conductor line, or
each of the plurality of solid conductor lines.

10. The method according to claim 9, wherein the plurality of solid conductor lines are formed into at least a pair of solid conductor lines with no internal channels.

11. The method according to claim 10, wherein the cooling fluid does not cover a complete circumference of the outer surface of the pair of conductor lines.

12. The method according to claim 9, wherein the cooling fluid does not cover single solid conductor line along a complete circumference.

13. The gradient coil assembly according to claim 1, wherein the cooling channel is made of a plastic material or stainless steel which is fixed to the solid conductor lines.

14. A gradient coil assembly for a magnetic resonance imaging system comprising:
- a gradient coil comprised of a solid electrical conductor material forming a single solid conductor line with no interior channel; and
- a cooling channel affixed along an outside surface of the single solid conductor line in such a way that in a cross-sectional view, one single continuous interface line between the cooling channel and the single solid conductor line is formed such that the cooling fluid directly contacts a part of the outside surface of the single solid conductor line.

15. The gradient coil assembly according to claim 14, wherein the cooling channel is open at one side forming a U-shape or C-shape, the open side being between the cooling channel and the single solid conductor line such that the cooling fluid directly contacts the outside surface of the single solid conductor line.

16. The gradient coil assembly according to claim 15, wherein the cooling channel is formed along less than a complete circumference of the single solid conductor line.

17. The gradient coil assembly according to claim 16, wherein the single solid conductor line is rectangular in transverse cross-section.

18. The gradient coil assembly according to claim 16, wherein the single solid conductor line and the cooling channel are co-extruded.

19. The gradient coil assembly according to claim 16, wherein the single solid electrical conductor is copper or aluminum and the cooling channel is fabricated of one of plastic and stainless steel.

20. A magnetic resonance imaging system including the gradient coil system of claim 14.

* * * * *